US009917335B2

(12) United States Patent
Jarvis et al.

(10) Patent No.: US 9,917,335 B2
(45) Date of Patent: Mar. 13, 2018

(54) METHODS FOR DETERMINING AND CONTROLLING BATTERY EXPANSION

(71) Applicant: Apple Inc., Cupertino, CA (US)

(72) Inventors: Daniel W. Jarvis, Cupertino, CA (US); David M. DeMuro, Cupertino, CA (US); Hongli Dai, Cupertino, CA (US); Julian Malinski, Miami Beach, FL (US); Julien Marcil, Cupertino, CA (US); Meng Chi Lee, Cupertino, CA (US); Richard Hung Minh Dinh, Cupertino, CA (US); Rishabh Bhargava, Oakland, CA (US); Steven D. Sterz, Cupertino, CA (US); Richard M. Mank, Cupertino, CA (US); Soundararajan Manthiri, Cupertino, CA (US); Vijayasekaran Boovaragavan, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 185 days.

(21) Appl. No.: 14/838,395

(22) Filed: Aug. 28, 2015

(65) Prior Publication Data

US 2016/0064780 A1 Mar. 3, 2016

Related U.S. Application Data

(60) Provisional application No. 62/043,263, filed on Aug. 28, 2014.

(51) Int. Cl.
*H01M 10/05* (2010.01)
*H01M 10/42* (2006.01)
(Continued)

(52) U.S. Cl.
CPC ....... *H01M 10/4257* (2013.01); *H01M 10/48* (2013.01); *G01R 31/3606* (2013.01);
(Continued)

(58) Field of Classification Search
CPC ........................................................ H01M 10/05
See application file for complete search history.

(56) References Cited

U.S. PATENT DOCUMENTS 2,798,895 A 7/1957 Nowotny
2,798,896 A 7/1957 Bly
(Continued)

FOREIGN PATENT DOCUMENTS

CN 101702412 5/2010
EP 0792741 2/1986
(Continued)

*Primary Examiner* — Jacob Marks
(74) *Attorney, Agent, or Firm* — Brownstein Hyatt Farber Schreck, LLP

(57) ABSTRACT

Methods and systems for detecting and compensating for expansion of rechargeable batteries over time. An expansion detector may be coupled to or positioned proximate a rechargeable battery to monitor for expansion thereof. After expansion exceeding a selected threshold is detected, the expansion detector may report the expansion to an associated processing unit. The processing unit may undertake to arrest further rechargeable battery expansion by modifying or changing one or more characteristics of charging and/or discharging circuitry coupled to the rechargeable battery. For example, the processing unit may charge the rechargeable battery at a lower rate or with reduced voltage after detecting expansion.

22 Claims, 12 Drawing Sheets

206a
202
204
206b

(51) Int. Cl.
*H01M 10/48* (2006.01)
*G01R 31/36* (2006.01)
*H01M 10/44* (2006.01)

(52) U.S. Cl.
CPC .......... *H01M 10/44* (2013.01); *H01M 10/445* (2013.01); *H01M 2010/4271* (2013.01); *H01M 2220/30* (2013.01)

(56) References Cited

U.S. PATENT DOCUMENTS

| | | | |
|---|---|---|---|
| 4,152,825 | A | 5/1979 | Bruneau |
| 4,344,603 | A | 8/1982 | Hozumi |
| 4,455,026 | A | 6/1984 | Pinkus |
| 5,238,222 | A | 8/1993 | Sumida |
| 5,580,676 | A | 12/1996 | Honda et al. |
| 6,106,973 | A | 8/2000 | Sonozaki et al. |
| 6,174,164 | B1 | 1/2001 | Masjedi |
| 6,358,644 | B1 | 3/2002 | Shibata et al. |
| 6,368,744 | B1 | 4/2002 | Hatazawa et al. |
| 6,448,621 | B1 * | 9/2002 | Thakur .................. G01L 1/005 205/343 |
| 6,528,204 | B1 | 3/2003 | Hikmet et al. |
| 6,549,756 | B1 | 4/2003 | Engstrom |
| 6,790,178 | B1 | 9/2004 | Mault et al. |
| 6,924,551 | B2 | 8/2005 | Rumer et al. |
| 7,103,407 | B2 | 9/2006 | Hjelt et al. |
| 7,270,910 | B2 | 9/2007 | Yahnker et al. |
| 7,288,340 | B2 | 10/2007 | Iwamoto |
| 7,356,923 | B2 | 4/2008 | Honer |
| 7,622,895 | B1 | 11/2009 | Griffin |
| 7,663,064 | B2 | 2/2010 | Dutta et al. |
| 7,714,542 | B2 | 5/2010 | Lee et al. |
| 7,887,948 | B2 | 2/2011 | Jang et al. |
| 7,910,243 | B2 | 3/2011 | Koh et al. |
| 7,948,208 | B2 | 5/2011 | Partovi et al. |
| 7,952,322 | B2 | 5/2011 | Partovi et al. |
| 7,972,721 | B2 | 7/2011 | Kozu et al. |
| 7,976,981 | B2 | 7/2011 | Lee |
| 8,031,122 | B2 | 10/2011 | Jang et al. |
| 8,034,477 | B2 | 10/2011 | Yamada |
| 8,040,110 | B2 | 10/2011 | Al-Anbuky et al. |
| 8,119,278 | B2 | 2/2012 | Bailey et al. |
| 8,124,269 | B2 | 2/2012 | Takahashi et al. |
| 8,169,185 | B2 | 5/2012 | Partovi et al. |
| 8,241,786 | B2 | 8/2012 | Taniguchi et al. |
| 8,253,388 | B2 | 8/2012 | Cordes et al. |
| 8,259,013 | B2 | 9/2012 | Jang et al. |
| 8,260,371 | B2 | 9/2012 | Kawata et al. |
| 8,293,402 | B2 | 10/2012 | Lee |
| 8,345,420 | B2 | 1/2013 | McClure et al. |
| 8,427,825 | B2 | 4/2013 | Szczypinski |
| 8,445,125 | B2 | 5/2013 | Baek et al. |
| 8,518,569 | B2 | 8/2013 | Murphy et al. |
| 8,526,998 | B2 | 9/2013 | Koide et al. |
| 8,558,509 | B2 | 10/2013 | He et al. |
| 8,603,670 | B2 | 12/2013 | Taniguchi et al. |
| 8,629,652 | B2 | 1/2014 | Partovi et al. |
| 8,629,654 | B2 | 1/2014 | Partovi et al. |
| 8,679,674 | B2 | 3/2014 | Liang et al. |
| 8,778,529 | B2 | 7/2014 | Seo |
| 8,890,470 | B2 | 11/2014 | Partovi |
| 8,896,264 | B2 | 11/2014 | Partovi |
| 8,901,881 | B2 | 12/2014 | Partovi |
| 8,920,949 | B2 | 12/2014 | Hashimoto et al. |
| 8,936,653 | B2 | 1/2015 | Kim et al. |
| 8,942,409 | B2 | 1/2015 | Kantor et al. |
| 8,947,047 | B2 | 2/2015 | Partovi et al. |
| 8,989,821 | B2 | 3/2015 | Pope et al. |
| 8,999,566 | B2 | 4/2015 | Chung et al. |
| 9,040,192 | B2 | 5/2015 | Lee et al. |
| 9,106,083 | B2 | 8/2015 | Partovi |
| 9,112,362 | B2 | 8/2015 | Partovi |
| 9,112,363 | B2 | 8/2015 | Partovi |
| 9,112,364 | B2 | 8/2015 | Partovi |
| 9,136,510 | B2 | 9/2015 | Werner |
| 9,172,088 | B2 | 10/2015 | Loveness et al. |
| 9,178,369 | B2 | 11/2015 | Partovi |
| 9,301,034 | B2 | 3/2016 | Kantor et al. |
| 9,593,969 | B2 | 3/2017 | King |
| 2002/0094475 | A1 | 7/2002 | Aoyama |
| 2003/0129483 | A1 | 7/2003 | Gross |
| 2005/0142439 | A1 | 6/2005 | Lee et al. |
| 2007/0260136 | A1 | 11/2007 | Hunter |
| 2007/0264535 | A1 | 11/2007 | Lee et al. |
| 2008/0001573 | A1 | 1/2008 | Carey |
| 2008/0286644 | A1 | 11/2008 | Yeo |
| 2009/0317708 | A1 | 12/2009 | Brandl et al. |
| 2010/0026240 | A1 | 2/2010 | Jiang et al. |
| 2010/0052603 | A1 | 3/2010 | Bourilkov et al. |
| 2010/0081049 | A1 | 4/2010 | Holl et al. |
| 2010/0316911 | A1 | 12/2010 | Tesson et al. |
| 2011/0014954 | A1 | 1/2011 | Dossas et al. |
| 2011/0043309 | A1 | 2/2011 | Wamala et al. |
| 2011/0050164 | A1 | 3/2011 | Partovi et al. |
| 2011/0175569 | A1 | 7/2011 | Austin |
| 2011/0215480 | A1 | 9/2011 | Gorczyca et al. |
| 2011/0221385 | A1 | 9/2011 | Partovi et al. |
| 2011/0223447 | A1 | 9/2011 | Ignor et al. |
| 2011/0236727 | A1 | 9/2011 | Jang |
| 2012/0116176 | A1 | 5/2012 | Moravec et al. |
| 2012/0121944 | A1 | 5/2012 | Yamamoto et al. |
| 2012/0305605 | A1 | 12/2012 | Vaussaux et al. |
| 2013/0034763 | A1 | 2/2013 | Byun |
| 2013/0071696 | A1 | 3/2013 | Kim et al. |
| 2013/0093388 | A1 | 4/2013 | Partovi |
| 2013/0099563 | A1 | 4/2013 | Partovi et al. |
| 2013/0171490 | A1 | 7/2013 | Rothkopf et al. |
| 2013/0249479 | A1 | 9/2013 | Partovi |
| 2013/0260677 | A1 | 10/2013 | Partovi |
| 2013/0271069 | A1 | 10/2013 | Partovi |
| 2013/0285604 | A1 | 10/2013 | Partovi |
| 2013/0285605 | A1 | 10/2013 | Partovi |
| 2013/0300204 | A1 | 11/2013 | Partovi |
| 2013/0323055 | A1 | 12/2013 | Eden et al. |
| 2014/0065474 | A1 | 3/2014 | Werner et al. |
| 2014/0103873 | A1 | 4/2014 | Partovi et al. |
| 2014/0132210 | A1 | 5/2014 | Partovi |
| 2014/0147703 | A1 | 5/2014 | Werner et al. |
| 2014/0191568 | A1 | 7/2014 | Partovi |
| 2014/0248523 | A1 * | 9/2014 | Roh ....................... H01M 2/34 429/121 |
| 2014/0306654 | A1 | 10/2014 | Partovi |
| 2015/0043156 | A1 | 2/2015 | Jain et al. |
| 2015/0130412 | A1 | 5/2015 | Partovi |
| 2015/0145475 | A1 | 5/2015 | Partovi et al. |
| 2015/0185055 | A1 | 7/2015 | King |
| 2015/0220109 | A1 | 8/2015 | von Badinski et al. |
| 2015/0255776 | A1 | 9/2015 | Dabov |
| 2015/0256007 | A1 | 9/2015 | Zadesky et al. |
| 2016/0080614 | A1 | 3/2016 | Hollinger et al. |
| 2016/0260945 | A1 | 9/2016 | Rothkopf et al. |
| 2016/0268830 | A1 | 9/2016 | Zadesky et al. |

FOREIGN PATENT DOCUMENTS

| | | |
|---|---|---|
| EP | 1931010 | 6/2008 |
| EP | 2540221 | 1/2013 |
| EP | 2653053 | 10/2013 |
| JP | 61032951 | 2/1986 |
| JP | 63314770 | 12/1988 |
| JP | 10012200 | 1/1998 |
| JP | 2000058018 | 2/2000 |
| JP | 2001118547 | 4/2001 |
| JP | 2001250515 | 9/2001 |
| JP | 2001250516 | 9/2001 |
| JP | 2001332752 | 11/2001 |
| JP | 2005108750 | 4/2005 |
| JP | 2005129260 | 5/2005 |
| JP | 2005268138 | 9/2005 |
| JP | 2007048725 | 2/2007 |
| JP | 2007165200 | 6/2007 |
| JP | 2010021074 | 1/2010 |
| KR | 20010007769 | 2/2005 |

(56) References Cited

FOREIGN PATENT DOCUMENTS

| | | |
|---|---|---|
| KR | 20090075396 | 7/2009 |
| WO | WO00/41252 | 7/2000 |
| WO | WO2008/023199 | 2/2008 |
| WO | WO2011/000239 | 1/2011 |
| WO | WO2011/095758 | 8/2011 |

* cited by examiner

METHODS FOR DETERMINING AND CONTROLLING BATTERY EXPANSION

CROSS-REFERENCE TO RELATED APPLICATIONS

This application is a nonprovisional patent application of and claims the benefit to U.S. Provisional Patent Application No. 62/043,263, filed Aug. 28, 2014 and titled "Methods for Determinging and Controlling Battery Expansion," the disclosure of which is hereby incorporated herein in its entirety.

TECHNICAL FIELD

Embodiments described herein relate to battery charging systems, and more particularly, to systems and methods for determining and controlling expansion of rechargeable batteries over time.

BACKGROUND

Portable electronic devices may include one or more batteries that may require recharging from time to time. Such devices may include electric vehicles, cell phones, smart phones, tablet computers, laptop computers, wearable devices, navigation devices, sports devices, health analysis devices, medical data devices, location tracking devices, accessory devices, home appliances, peripheral input devices, remote control devices, and so on. As a result of high packing density, high energy density, long cycle life, and ease of mass production, portable electronic devices typically include one or more lithium-polymer or lithium-ion batteries.

Over the operational life of a lithium-polymer rechargeable battery, the internal resistance of the rechargeable battery may increase as a result of oxidation, lithium dendrite growth, cathodic gas evolution, and/or cathodic degradation, due at least in part to repeated charging and discharging of the rechargeable battery. As a result, the power output capacity of the rechargeable battery may decrease over time, undesirably limiting the useful life of the rechargeable battery and/or the portable electronic device. In other examples, non-optimal charging conditions can also effect an increase in internal resistance of the rechargeable battery. For example, the internal resistance of the battery may increase as a result of charging at high voltage, delayed transition from constant current to constant voltage charging, and/or charging or discharging at a high temperature. In many examples, the internal resistance of the rechargeable battery may correlate or correspond to target charge capacity, rechargeable battery health, and/or rechargeable battery age.

In addition, lithium-polymer batteries may physically expand or swell during charging of the rechargeable battery. For example, the anode material can expand substantially over repeated charging cycles or even during a single charging cycle. In other cases, gas emissions from a charged cathode can, over time, result in an expanded rechargeable battery. Over time, the rechargeable battery can expand beyond its allotted volume within the portable electronic device, damaging components and/or portions the portable electronic device. In these cases, a user of a portable electronic device may be entirely unaware of the expansion of the rechargeable battery until conspicuous physical damage occurs.

Accordingly, there may be a present need for a method and system for detecting, arresting, mitigating, and compensating for rechargeable battery expansion.

SUMMARY

Embodiments descried herein may relate to, include, or take the form of methods and systems for detecting and compensating for rechargeable battery expansion over time.

For example, certain embodiments described herein may take the form of an electronic device including at least a housing, a rechargeable battery within the housing, a processing unit configured to control the electrical input received from a power source coupled to the rechargeable battery, and an expansion detector electrically coupled to the processing unit. In these embodiments, the expansion detector can send an expansion signal to the processing unit upon determining that the rechargeable battery has expanded, and in response to receiving the expansion signal, the processing unit can modify one or more characteristics of the electrical input. For example, the processing unit may modify the output voltage, current, or scheduling of the electrical input.

In certain embodiments, the expansion detector may be any suitable sensor or detector configured to detect dimensional expansion of the rechargeable battery. For example, in certain embodiments the expansion detector may be a capacitive sensor. The capacitive sensor can measure for changes in capacitance between two or more electrically conductive surfaces. In certain embodiments, at least one of the surfaces may be a surface of the rechargeable battery. In one example, a second surface may be a surface of the housing of the electronic device. Upon expansion of the rechargeable battery, the distance between the first and second surface may change and according, the capacitance between the first and second surface can change. In this manner, the capacitive sensor may determine that the rechargeable battery has expanded.

In other examples the capacitive sensor can be positioned elsewhere to detect a dimensional expansion of the rechargeable battery. For example, one electrically conductive plate may be positioned on a top surface of the rechargeable battery and another electrically conductive plate may be positioned on a bottom surface of the rechargeable battery. In further examples, one electrically conductive plate may be positioned within the rechargeable battery and another electrically conductive plate may be positioned outside the rechargeable battery. In other examples, the capacitive sensor may be pixelized in order to determine expansion of the rechargeable battery at more than one location.

Other embodiments may include a configuration in which the expansion detector includes a strain sensor coupled to an external surface of the rechargeable battery, a resistance sensor coupled to an external surface of the rechargeable battery, an acoustic resonance sensor, a photo interrupter positioned across the rechargeable battery, a contact switch, or a pressure sensor. Each of these example expansion detectors may send an expansion signal to the processing unit upon determining that the rechargeable battery has expanded beyond a selected threshold.

Other embodiments described herein may relate to, include, or take the form of a rechargeable battery within the housing of a portable electronic device, the rechargeable battery including at least a rechargeable battery module, a pouch containing the rechargeable battery module, and a rechargeable battery expansion detector electrically coupled to a processing unit associated with the portable electronic device. In these embodiments, the expansion detector can send an expansion signal to the processing unit upon determining that the rechargeable battery has expanded, and in response to receiving the expansion signal, the processing unit can modify one or more characteristics of the electrical input, such as the output voltage, current, or scheduling of the electrical input.

These embodiments may include a configuration in which the expansion detector includes a capacitive sensor, a strain sensor coupled to an external surface of the rechargeable battery, a resistance sensor coupled to an external surface of the rechargeable battery, an acoustic resonance sensor, a photo interrupter positioned across the rechargeable battery, a contact switch, or a pressure sensor. Each of these example expansion detectors may send an expansion signal to the processing unit upon determining that the rechargeable battery has expanded beyond a selected threshold.

Certain embodiments described herein may also relate to, include, or take the form of a method for adjusting power output from a power supply configured to charge a rechargeable battery, the method including at least the operations of determining whether the rechargeable battery has expanded beyond a selected threshold, and changing one or more power output characteristics of the power supply in response to determining that the selected threshold may be exceeded. For example, the output voltage, current, or scheduling of the electrical input and/or power source may be changed in response to determining that the rechargeable battery has expanded.

Additional embodiments described herein may also relate to, include, or take the form of a method for adjusting power output from a power supply configured to charge a rechargeable battery, the method including at least the operations of determining whether the output power presents a risk of rechargeable battery expansion, determining whether the risk of rechargeable battery expansion exceeds a selected threshold, and changing one or more power output characteristics of the power supply in response to determining that the selected threshold may be exceeded. For example, the output voltage, current, or scheduling of the electrical input and/or power source may be changed in response to determining that the rechargeable battery has expanded.

These embodiments may determine an increased risk of rechargeable battery expansion by, for example, determining whether the age of the rechargeable battery exceeds a selected age, determining whether the charge/discharge cycle count of the rechargeable battery exceeds a selected maximum, determining whether the temperature of the rechargeable battery exceeds a selected temperature threshold, determining whether the rate of expansion exceeds a selected rate threshold, or determining whether the internal resistance of the rechargeable battery exceeds a selected resistances threshold.

BRIEF DESCRIPTION OF THE FIGURES

Reference will now be made to representative embodiments illustrated in the accompanying figures. It should be understood that the following descriptions are not intended to limit the disclosure to one preferred embodiment. To the contrary, the following descriptions are intended to cover alternatives, modifications, and equivalents as may be included within the spirit and scope of the described embodiments as defined by the appended claims.

The use of the same or similar reference numerals in different drawings indicates similar, related, or identical items.

DETAILED DESCRIPTION

Figure 1:
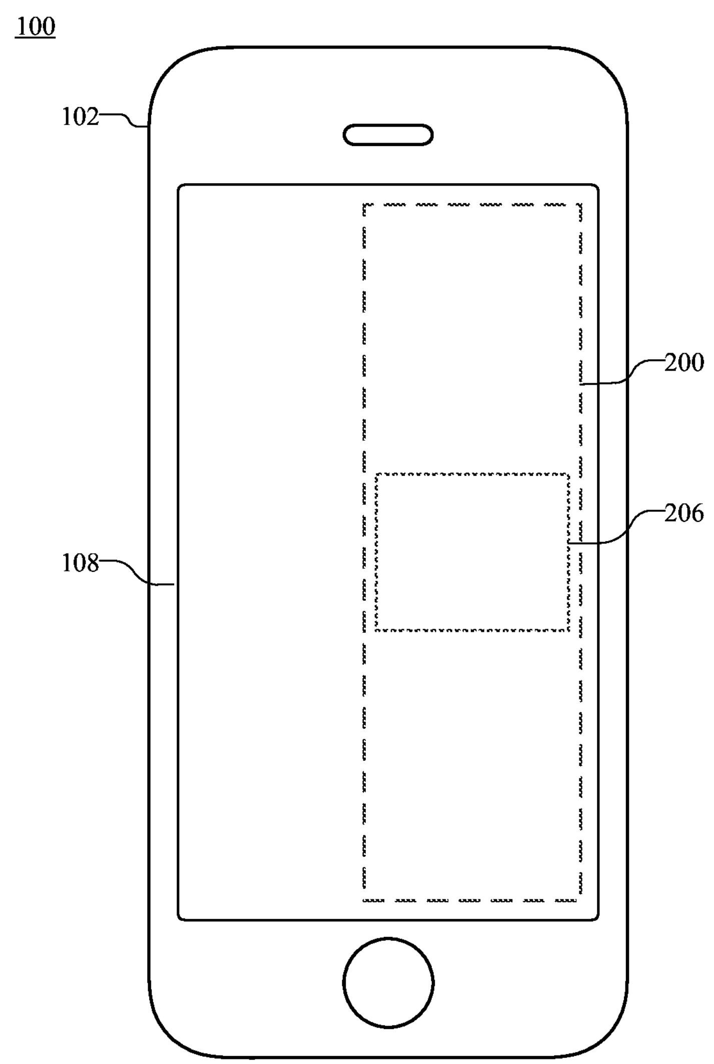
FIG. 1 depicts an example front view of a portable electronic device that may include one or more internal rechargeable batteries.

Many embodiments described herein may relate to methods and systems for detecting, arresting, mitigating and/or compensating for battery expansion over time, and in several cases with respect to rechargeable batteries. Although many embodiments are described herein with reference to batteries for use with portable electronic devices, it should be appreciated that some embodiments can take other forms and may be included within different form factors. Accordingly, it should be appreciated that the various embodiments described herein, as well as the functionality, operation, components, and capabilities thereof may be combined with other elements as necessary, and so any physical, functional, or operational discussion of an element or feature is not intended to be limited solely to a particular embodiment to the exclusion of others.

Certain embodiments may be suitable for inclusion within the housing of a portable electronic device. For example, some embodiments include an expansion detector configured to monitor battery expansion over the life of a rechargeable battery. After expansion beyond a selected threshold is detected, the expansion detector may send a signal to a processing unit associated with the portable electronic device. In response to receiving the expansion signal, the processing unit may adjust one or more characteristics and/or settings of the charging or discharging control circuitry of the portable electronic device.

In one embodiment, if expansion is detected, the processing unit may configure charging circuitry to reduce the voltage applied to charge the rechargeable battery. In other examples, the processing unit may update a function used to determine the appropriate voltage applied to charge the rechargeable battery. For example, some embodiments may select the voltage to charge a rechargeable battery as a function of rechargeable battery age, rechargeable battery health, rechargeable battery temperature, ambient temperature, and/or characteristics related to the charger connected to the portable electronic device. Thus, certain embodiments may change the characteristic on which the voltage charging function depends as the battery swells or contracts.

In these examples, if expansion is detected, the processing unit may adjust the determined rechargeable battery age or the determined rechargeable battery health (or other measured or calculated values) in order to effect a change to the characteristics of the function that determines the voltage applied to the rechargeable battery. More particularly, in some embodiments, if expansion is detected, effective rechargeable battery age may be increased and/or effective rechargeable battery health may be decreased. Each of these adjustments may result in a reduction of the voltage applied to charge the rechargeable battery. Conversely, if the effective age or health of the rechargeable battery is decreased, the voltage applied to charge the battery may be increased.

In other examples, the processing unit may terminate charging or discharging immediately if expansion is detecting in order to prevent permanent damage to the portable electronic device. For example in certain embodiments the expansion detector and/or processing unit may monitor for rechargeable battery expansion rate in addition to rechargeable battery expansion. In one example, a low rechargeable battery expansion rate may be expected as a result of normal aging and use of the rechargeable battery. In a second example, an accelerated rechargeable battery expansion rate may indicate a rechargeable battery failure, manufacturing defect, premature mechanical or chemical failure, physical damage to the rechargeable battery, unsafe charging/discharging conditions, use of third-party or otherwise unknown chargers, or any other potentially unexpected circumstance. In these and related embodiments, the portable electronic device may respond differently to different rechargeable battery expansion rates. Continuing the example, the portable electronic device may adjust charging or discharging conditions in response to the first detected rechargeable battery expansion rate whereas the portable electronic device may actively terminate all power, may trigger one or more power protections circuits, and/or may trigger one or more sacrificial components to attempt to arrest the accelerated expansion of the rechargeable battery.

In still further examples, the portable electronic device may provide a notification of rechargeable battery expansion to a user or a third-party. For example, the third party may be a manufacturer of the portable electronic device or the rechargeable battery. The notification may provide the third party with usage statistics (either anonymized or specific to a particular device or user). In another example, the notification may inform a user or the third-party that the rechargeable battery may be in need of reconditioning or replacement.

In certain embodiments, the expansion detector may be any suitable sensor or detector configured to detect dimensional expansion of the rechargeable battery. For example, in certain embodiments the expansion detector may be a capacitive sensor. The capacitive sensor can measure changes in capacitance between two or more electrically conductive surfaces. In these embodiments, the electrically conductive surfaces may be positioned such that expansion of the rechargeable battery causes the plates to move closer together or farther apart. For example, in one embodiment, capacitance changes between a top and bottom surface of the rechargeable battery may be measured. Thus, increases in capacitance may equate to swelling or other expansion of the battery, while decreases in capacitance indicate a contraction of the battery.

In many embodiments, one or more expansion detectors may send an expansion signal to a processing unit upon determining that the rechargeable battery has expanded beyond a selected threshold. In many examples, the processing unit may be associated with the portable electronic device, although this is not required. For example, the processing unit receiving the expansion signal may be a processing unit adapted to control the charging and dissipation of the rechargeable battery.

Upon receiving the expansion signal, the processing unit may undertake to mitigate or arrest further expansion of the rechargeable battery. For example, in certain embodiments, the processing unit may, in response to receiving the expansion signal, alter one or more characteristics of the charging or discharging cycle of the rechargeable battery. For example, conventional lithium-ion and/or lithium polymer batteries may be charged with constant current until cell voltage reaches a selected maximum (e.g., 4.2 volts as one non-limiting example). Thereafter, the rechargeable battery may be charged with constant current at the selected maximum. Accordingly, embodiments described herein may configure the processing unit to reduce the maximum charge voltage applied to charge the rechargeable battery by a certain selected amount in response to receiving an expansion signal.

In certain examples, the processing unit can reduce the maximum charge voltage by an amount proportional to the expansion of the rechargeable battery. For example, if the rechargeable battery is determined to have expanded by three percent, the maximum charge voltage may be reduced by three percent or any other suitable proportional amount (e.g., a direct proportional adjustment need not be used; some embodiments may vary the voltage reduction according to a non-linear relationship between the voltage and expansion or volume). In other examples, the maximum charge voltage can be reduced in steps. For example, if the rechargeable battery is determined to have expanded three percent, the maximum charge voltage may be reduced by 50 mV as a non-limiting example. Upon further expansion of the rechargeable battery, the maximum charge voltage may be further reduced in increments of 50 mV (again, as a non-limiting example)

In still further examples, the maximum charge voltage of the rechargeable battery can be reduced in response to an age calculation or determination of the rechargeable battery. For example, if the rechargeable battery is designed to be charged and discharged 1000 times, the processing unit may expect the rechargeable battery life to be half over after 500 charge/discharge cycles. In these embodiments, the maximum charge voltage of the rechargeable battery can be adjusted upon reaching a threshold charge/discharge count. For example, for every 50 charge/discharge cycles, the maximum charge voltage of the rechargeable battery may be reduced by 50 mV. Still further embodiments may increase the maximum charge voltage applied to a rechargeable battery in response to a determination that the rechargeable battery has a higher than expected capacity.

In other examples, battery age may be determined or approximated based at least in part on the target charge capacity of the rechargeable battery at a particular time. For example, the processing unit may compare the target charge capacity of the rechargeable battery to the designed capacity of the rechargeable battery. More particularly, if a rechargeable battery is designed to hold 1000 mAh but is measured after some time as having a target charge capacity of only 900 mAh, the processing unit may conclude that the rechargeable battery has lost ten percent of its total capacity. In response to the determination that the rechargeable battery has lost ten percent capacity, the maximum charge voltage may be reduced.

In some examples, the processing unit may be a processing unit associated with a portable electronic device. In other examples the processing unit instead may be a power management unit dedicated to controlling the power input to the rechargeable battery. In other embodiments, the processing unit instead may be a power management unit contained within the battery package itself. In still further embodiments, the processing unit may be associated with an external power supply such as a power adapter.

Accordingly, many embodiments described herein may detect rechargeable battery expansion via an expansion detector and/or via direct or indirect measurements or estimations of battery age or health. Thereafter, charging and/or discharging characteristics such as maximum charge voltage may be adjusted to mitigate further expansion or capacity degradation over time. In this manner, the useful life of portable electronic devices and/or rechargeable batteries associated therewith may be extended.

FIG. 1 depicts an example front view of a portable electronic device 100 which may include one or more rechargeable batteries 200. The sample illustrated embodiment shows the portable electronic device 100 as a cellular telephone, although this embodiment is not required. Portable, semi-portable, or stationary devices that can include rechargeable batteries may include electric vehicles, tablet computers, laptop computers, wearable devices, navigation devices, sports devices, health analysis devices, medical data devices, location tracking devices, accessory devices, home appliances, peripheral input devices, remote control devices, and so on.

The portable electronic device 100, such as depicted in FIG. 1, may include a housing 102, one or more input buttons 104, 106, and a display 108. In some examples, the display 108 may include sensors for receiving touch and/or force input.

In many examples, the portable electronic device 100 may include a processing unit coupled with or in communication with a memory, one or more communication interfaces, output devices such as speakers, and one or more input devices such as buttons, dials, microphones, or touch-based and/or force-based interfaces. The communication interface(s) can provide electronic communications between the portable electronic device 100 and any external communication network, device, or platform, such as but not limited to wireless interfaces, Bluetooth interfaces, Near Field Communication interfaces, infrared interfaces, USB interfaces, Wi-Fi interfaces, TCP/IP interfaces, network communications interfaces, or any conventional communication interfaces. The portable electronic device 100 may provide information regarding time, health, statuses or externally connected or communicating devices and/or software executing on such devices, messages, video, operating commands, and so forth (and may receive any of the foregoing from an external device), in addition to communications.

In many cases, the portable electronic device 100 may include the rechargeable batteries 200 completely within the housing 102. For example, the rechargeable battery 200 may be manufactured or otherwise sealed entirely within the housing 102. In another example, the rechargeable battery 200 may be accessible to a user by removing one or more portions of the housing 102.

The rechargeable battery 200 may be selected from or any number of suitable or conventional rechargeable battery technologies. However, as noted above, many rechargeable batteries may be subject to swelling or expansion over the operational life of the rechargeable battery and/or given certain non-optimal charging or discharging conditions.

For example, repeated charging and discharging of the rechargeable battery 200 may increase the risk that the rechargeable battery may expand. In other examples, charging the rechargeable battery 200 in high temperature conditions may cause and/or accelerate expansion of the rechargeable battery 200. In still further examples, the risk of rechargeable battery expansion may increase with rechargeable battery age and/or decreased rechargeable battery health.

Over time, the rechargeable battery 200 may expand beyond the volume allotted for the rechargeable battery within the housing 102 of the portable electronic device 100 and, accordingly, may physically damage components and/or portions of the housing 102 or the portable electronic device 100. For example, as depicted in FIG. 1, the display 108 may be damaged as a result of the expansion of the rechargeable battery 200.

Accordingly, many embodiments described herein relate to and take the form of methods to detect, arrest, and/or prevent expansion of the rechargeable battery 200 over the operational life of the portable electronic device 100. Many embodiments include one or more expansion detectors 206 that are configured and adapted to detect the expansion of the rechargeable battery 200. After an expansion of the rechargeable battery 200 is detected, the portable electronic device 100 can adjust how the rechargeable battery 200 is charged and/or discharged.

For example, in one embodiment, the portable electronic device 100 may charge the rechargeable battery 200 at a lower rate if an expansion of the rechargeable battery 200 is detected.

In another embodiment, the portable electronic device 100 may discharge the rechargeable battery 200 at a lower rate if an expansion of the rechargeable battery 200 is detected.

In another embodiment, the portable electronic device 100 may alert the user or a third-party, for example by showing an alert on the display 108 or by sending a message via one or more communication channels, if an expansion of the rechargeable battery 200 is detected.

In another example, the portable electronic device 100 may lower a maximum charging temperature threshold of the rechargeable battery 200 such that the rechargeable battery 200 is prevented from receiving power when the rechargeable battery temperature and/or ambient temperature exceeds the temperature threshold. If the rechargeable battery 200 continues to expand, the portable electronic device may continue to lower the maximum charging temperature.

Figure 2A:
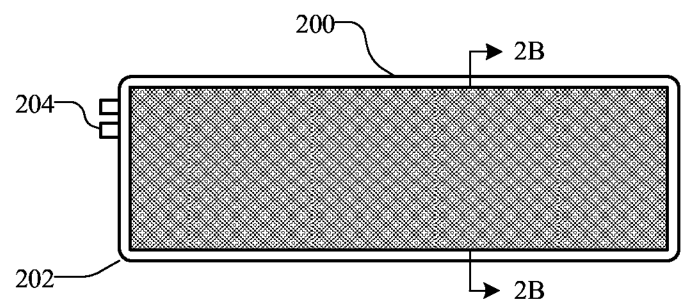
FIG. 2A depicts an example top plan view of a rechargeable battery.

FIG. 2A depicts an example top plan view of a rechargeable battery 200. In one embodiment, the rechargeable battery 200 may be a lithium-polymer rechargeable battery, although this is not required, and other rechargeable batteries or non-rechargeable batteries may be used in conjunction with or as elements of various systems and methods described herein.

The rechargeable battery 200 may be made from one or more independent rechargeable battery cells contained within an external housing 202 such as a flexible pouch. In many embodiments, each rechargeable battery cell contained within the rechargeable battery 200 may be made from a number of layers in a conventional jellyroll configuration. In these examples, the jellyroll configuration may include a cathode separated from an anode by a separator. The cathode and anode may be electrically coupled to two or more terminals 204.

Figure 2B:
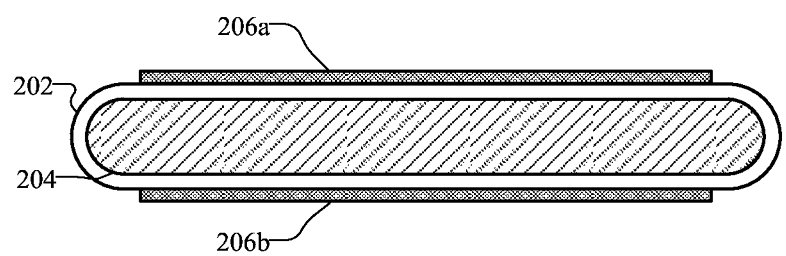
FIG. 2B depicts a cross-section taken along line 2B-2B of the rechargeable battery of FIG. 2A, showing the rechargeable battery and an expansion detector in an unexpanded state.

FIG. 2B depicts a cross-section taken along line 2B-2B of the rechargeable battery 200 of FIG. 2A, showing a simplified view of the rechargeable battery and an expansion detector 206 in an unexpanded state. The rechargeable battery 200 may be made from one or more independent rechargeable battery cells 204 contained within an external housing 202 such as a flexible pouch. The cells 204 may be arranged in the aforementioned jellyroll configuration.

As with respect to other embodiments described herein, the expansion detector 206 may be any suitable sensor or detector configured to detect dimensional expansion of the rechargeable battery. As illustrated, the expansion detector may be a capacitive sensor constructed from two or more electrically conductive surfaces 206*a*, 260*b*. The expansion detector 206 can measure for changes in capacitance between two or more electrically conductive surfaces 206*a*, 260*b*, for example, resulting from separation of the electrically conductive surfaces 206*a*, 260*b*. As illustrated a first electrically conductive surface 206*a* may be disposed or otherwise positioned on an upper surface or top surface of the external housing 202. In many embodiments, the first electrically conductive surface 206*a* may be positioned outside the housing, although this is not required. For example, the first electrically conductive surface 206*a* may be positioned within the housing in certain embodiments.

A second electrically conductive surface 206*b* may be disposed or otherwise positioned on a lower surface or a bottom surface of the external housing 202. Similar to the first electrically conductive surface 206*a*, the second electrically conductive surface 206*b* may be positioned outside the external housing 202, although this is not required.

In many examples the electrically conductive surfaces 206*a*, 206*b* may be plates or structures of metal (such as copper, aluminum, and silver), ceramic, compositions such as indium-tin oxide and carbon nanotubes, or any other suitable electrically conductive material. In these embodiments, the electrically conductive surfaces 206*a*, 206*b* may be made from the same or different materials. In other examples, the electrically conductive surfaces 206*a*, 206*b* may be adhered to the external housing 202 of the rechargeable battery 200 or a structure within the housing by any number of suitable methods. For example, an adhesive layer may be disposed between the electrically conductive surfaces 206*a*, 206*b* and the external surfaces of the external housing 202.

In certain examples, the electrically conductive surfaces 206*a*, 206*b* may be disposed, printed, deposited, or otherwise manufactured onto the rechargeable battery 200. For example, the electrically conductive surfaces 206*a*, 206*b* may be electrically conductive layers of the pouch that defines the external housing 202.

Figure 2C:
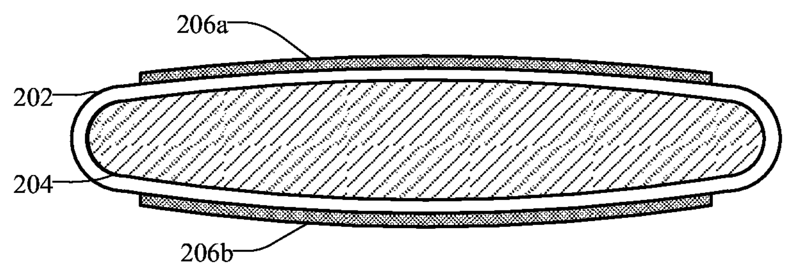
FIG. 2C depicts a cross-section taken along line 2B-2B of the rechargeable battery of FIG. 2A, showing the rechargeable battery and an expansion detector in an expanded state.

In these and related examples, the capacitance between the electrically conductive surfaces 206*a*, 206*b* may be correlated to the distance separating the electrically conductive surfaces 206*a*, 206*b*. In other words, the difference between a baseline capacitance between the electrically conductive surfaces 206*a*, 206*b* and a measured capacitance between electrically conductive surfaces 206*a*, 206*b* may correlate to the amount or distance that the rechargeable battery 200 has expanded. For example, as shown in FIG. 2C, an expanded rechargeable battery may result in a physical separation of the electrically conductive surfaces 206*a*, 206*b*. By periodically measuring or inferring the capacitance between the electrically conductive surfaces 206*a*, 206*b*, the expansion of the rechargeable battery 200 can be determined.

Figure 2D:
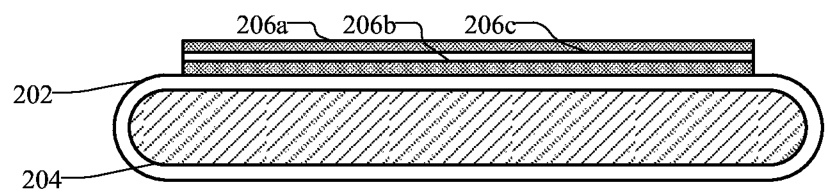
FIG. 2D depicts a cross-section taken along line 2B-2B of the rechargeable battery of FIG. 2A, showing the rechargeable battery and an alternate expansion detector in an unexpanded state.

As noted above, the configuration of electrically conductive surfaces 206*a*, 206*b* positioned on external and opposite surfaces of the rechargeable battery is not required. For example, FIG. 2D depicts a cross-section taken along line 2B-2B of the rechargeable battery of FIG. 2A, showing the rechargeable battery and an expansion detector 206 in an unexpanded state. In this example, the expansion detector 206 is made from the electrically conductive surfaces 206*a*, 206*b* separated by an insulator 206*c*. The material selected for the insulator 206*c* may be selected, at least in part, based on dielectric properties. In this example, expansion of the rechargeable battery 200 may result in a deformation of the electrically conductive surfaces 206*a*, 206*b* such that the capacitance between the electrically conductive surfaces 206*a*, 206*b* changes.

Figure 2E:
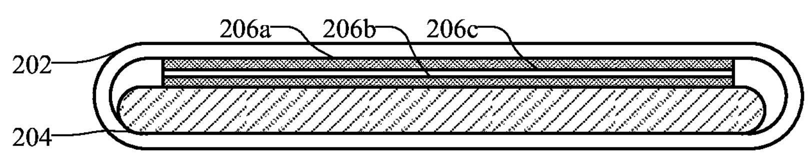
FIG. 2E depicts a cross-section taken along line 2B-2B of the rechargeable battery of FIG. 2A, showing the rechargeable battery and an alternate expansion detector in an unexpanded state.
Figure 2F:
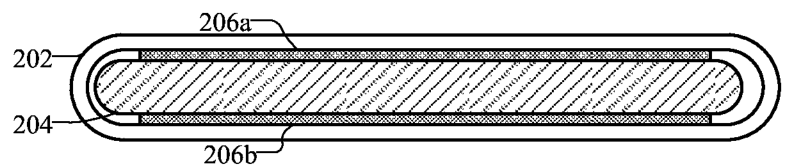
FIG. 2F depicts a cross-section taken along line 2B-2B of the rechargeable battery of FIG. 2A, showing the rechargeable battery and an alternate expansion detector in an unexpanded state.
Figure 2G:
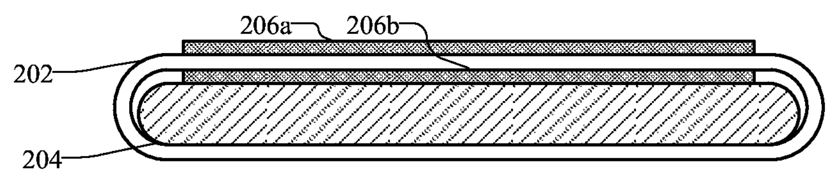
FIG. 2G depicts a cross-section taken along line 2B-2B of the rechargeable battery of FIG. 2A, showing the rechargeable battery and an alternate expansion detector in an unexpanded state.
Figure 2H:
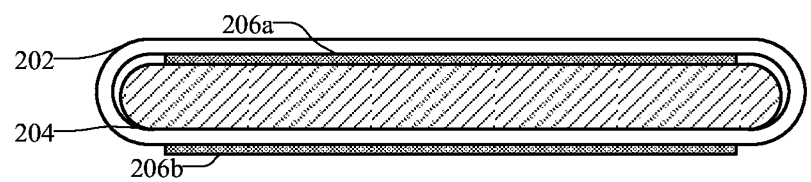
FIG. 2H depicts a cross-section taken along line 2B-2B of the rechargeable battery of FIG. 2A, showing the rechargeable battery and an alternate expansion detector in an unexpanded state.

In other embodiments, the electrically conductive surfaces 206*a*, 206*b* and the insulator 206*c* may be positioned within the external housing 202 of the rechargeable battery 200, for example as shown within FIG. 2E. In other embodiments, the insulator 206*c* may not be required. For example, as shown in FIG. 2F, one or more independent rechargeable battery cells 204 may separate the electrically conductive surfaces 206*a*, 206*b*. In still further embodiments, the electrically conductive surfaces 206*a*, 206*b* may be separated, at least in part by a portion of the external housing 202 of the rechargeable battery 200, for example as shown in FIG. 2G. In still further examples, the electrically conductive surfaces 206*a*, 206*b* may be separated by both a portion of the external housing 202 of the rechargeable battery 200 and a portion of the one or more independent rechargeable battery cells 204.

Figure 2I:
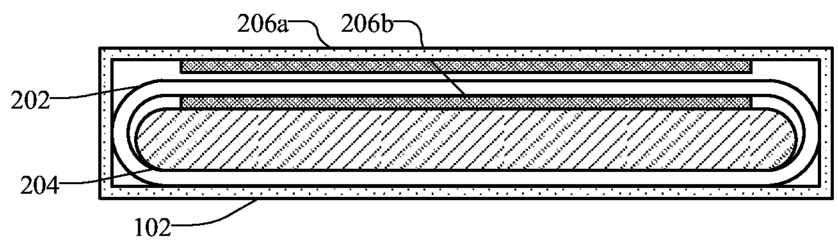
FIG. 2I depicts a cross-section taken along line 2B-2B of the rechargeable battery of FIG. 2A, showing the rechargeable battery and an alternate expansion detector in an unexpanded.

In still further embodiments, one of either the electrically conductive surfaces 206*a*, 206*b* may be physically coupled to a portion of the housing 102 of the portable electronic device (not pictured) or a structure within the housing, for example as shown in FIG. 2I. One may appreciate that the various configurations and layouts of the electrically conductive surfaces 206*a*, 206*b*, as illustrated and described with respect to FIGS. 2B-2H, may be modified or augmented to include one of the electrically conductive surfaces 206*a*, 206*b* on either an internal or external surface of the housing of the portable electronic device.

Figure 3:
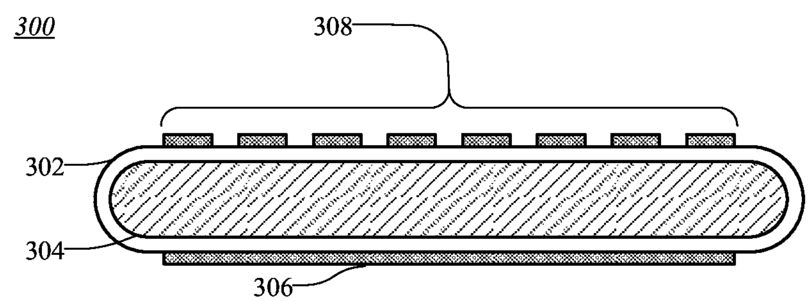
FIG. 3 depicts an example side cross-section of an example rechargeable battery and a pixelized expansion detector.

FIG. 3 depicts an example side cross-section of an example rechargeable battery 300 and a pixelized expansion detector. As described with respect to the embodiments illustrated in FIGS. 2A-2I, the pixelized expansion detector may be a capacitive sensor constructed from two or more electrically conductive surfaces 306, 308. The electrically conductive surface 308 may be formed into an array of independent electrically conductive surfaces (e.g., pixelized). In this manner, the expansion detector can measure changes in capacitance between each of the electrically conductive surfaces 308 in the array and the electrically conductive surface 306. Due to the pixelation of the electrically conductive surface 308, the expansion detector may be suitable for detecting expansion at various locations of the rechargeable battery 300.

Figure 4:
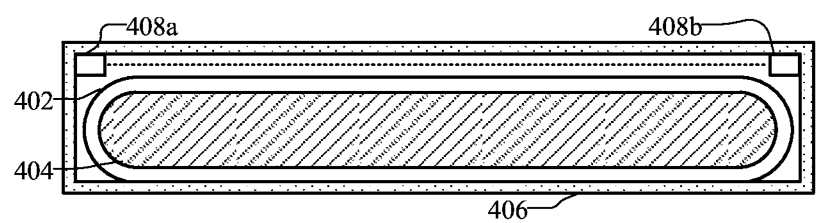
FIG. 4 depicts another example side cross-section of an example rechargeable battery and an expansion detector disposed within a housing.

FIG. 4 depicts another example side cross-section of an example rechargeable battery 400 and an expansion detector 408 disposed within a housing. In certain embodiments, the expansion detector 408 may be a photo interrupter positioned across the rechargeable battery, within a cavity defined between an external surface of the rechargeable battery and an internal surface of a housing 406. In certain embodiments the housing 406 may be a housing of a portable electronic device. In other embodiments, the housing 406 may be a rigid housing adapted to contain the rechargeable battery 400.

The photo interrupter may include a phototransmitter portion 408*a* and a photoreceiver portion 408*b*. As the rechargeable battery expands, the rechargeable battery may physically interrupt the optical path between the phototransmitter 408*a* and photoreceiver 408*b*. In this manner, interruption of the photo interrupter can indicate the expansion of the rechargeable battery. In some examples, the photoreceiver portion 408*b* may be a passive reflective element. In still other embodiments, the photo interrupter may be positioned to transmit and/or receive light through a through-hole within the rechargeable battery itself. In this manner, expansion of the rechargeable battery can move or otherwise alter the geometry of the through-hole, which in turn can interrupt the path of light therethrough.

In another embodiment, the expansion detector 408 may be an acoustic resonance sensor positioned in communication with an internal cavity of a portable electronic device. For example, the acoustic resonance sensor may emit a test pulse of sound from a transmitter 408*a* into the cavity defined between the rechargeable battery 400 and the housing 406 and monitor, with a receiver 408*b*, the acoustic resonance or resonance signature returned by the cavity. As the rechargeable battery expands, the acoustic resonance of the internal cavity may change. In this manner, the acoustic resonance sensor can indicate the expansion of the rechargeable battery. In some embodiments, the receiver 408*b* may be incorporated into the transmitter 408*a*.

In another embodiment, the expansion detector 408 may be a gas pressure sensor positioned in communication with a sealed internal cavity of a portable electronic device. The sealed internal cavity may be filled with any number of suitable gasses. The gas pressure sensor can detect the pressure of gas within the sealed internal cavity. As the rechargeable battery expands, the pressure within the sealed internal cavity may change. In this manner, the gas pressure sensor can indicate the expansion of the rechargeable battery.

Figure 5:
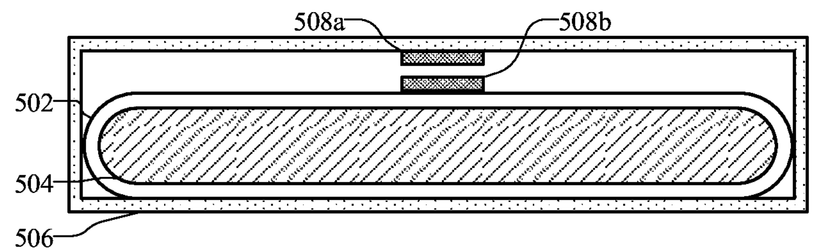
FIG. 5 depicts an example side cross-section of an example rechargeable battery and an expansion detector disposed within a housing.

FIG. 5 depicts an example side cross-section of an example rechargeable battery 500 and an expansion detector 508 disposed within a housing 506. The expansion detector may include one or more physical contact switches, each made from at least two electrically conductive surfaces 508*a*, 508*b*. For example, a first electrically conductive surface 508*a* disposed on an external surface of the rechargeable battery may come into physical contact with a second electrically conductive surface 508*b* upon expansion of the rechargeable battery. For example, the second electrically conductive surface 508*b* may be disposed on an interior surface of the housing 506 of the electronic device. As the rechargeable battery 500 expands, the first electrically conductive surface 508*a* may become nearer to the second electrically conductive surface 508*b*. Upon sufficient expansion, the first and second electrically conductive surfaces 508*a*, 508*b* may contact one another, thereby completing an electrical circuit. In this manner, the physical contact switch can indicate the expansion of the rechargeable battery.

Figure 6A:
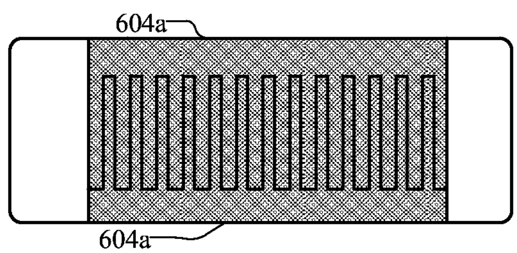
FIG. 6A depicts an example top plan view of an example rechargeable battery and an expansion detector disposed on an exterior surface of the rechargeable battery, showing the rechargeable battery in an unexpanded state.
Figure 6B:
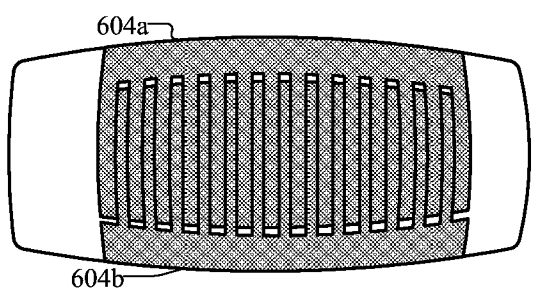
FIG. 6B depicts an example top plan view of an example rechargeable battery and an expansion detector disposed on an exterior surface of the rechargeable battery, showing the rechargeable battery in an expanded state.

FIG. 6A depicts an example top plan view of an example rechargeable battery 600 and a resistive expansion detector 604 disposed on an exterior surface of the rechargeable battery 600. As illustrated in FIG. 6A, the rechargeable battery is in an unexpanded state. The resistive expansion detector 604 may be formed from two or more interlocking or interlaced comb patterns 604*a*, 604*b*. As the rechargeable battery expands, the teeth of the combs 604*a*, 604*b* may slide apart or otherwise separate, which can change the electrical resistance between the one or more interlocking or interlaced combs for example as shown in FIG. 6B. In this manner, the resistance sensor can indicate the expansion of the rechargeable battery.

Figure 6C:
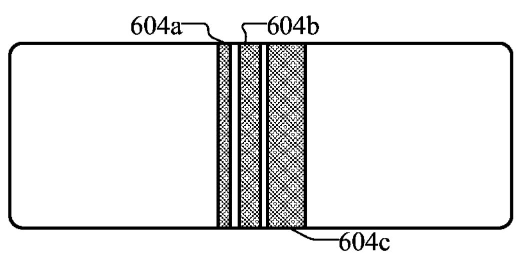
FIG. 6C depicts an example top plan view of an example rechargeable battery and another expansion detector disposed on an exterior surface of the rechargeable battery, showing the rechargeable battery in an unexpanded state.

FIG. 6C depicts a top plan view of an example rechargeable battery 600 and a resistive expansion detector 604 disposed on an exterior surface of the rechargeable battery 600. The resistive expansion detector 604 may be one or more sacrificial conductive strips configured to mechanically fail under tension. For example, a thin strip 604*a* of electrically conductive material may be disposed on an external surface of the rechargeable battery, such that when the rechargeable battery expands a certain amount, the thin strip 604*a* may be pulled apart under tension.

As a result of the physical break, the thin strip 604*a* may no longer conduct electricity. In this manner, the thin strip 604*a* can indicate the expansion of the rechargeable battery. In some embodiments, a sacrificial conductive strip may be directly connected to one or more terminals of the rechargeable battery such that when the sacrificial strip breaks, the rechargeable battery is immediately disconnected from charging or discharging circuitry. In this manner, the sacrificial strip may function as a fuse that is triggered by rechargeable battery expansion.

In some embodiments, more than one sacrificial conductive strip may be used. For example, each sacrificial strip may be adapted to break apart under different tension conditions. For example, a first sacrificial strip 604*a* may fail under a first tension and a second sacrificial strip 604*b* may fail under a second tension and a third sacrificial strip 604*c* may fail under a third tension. In this manner, the progressive failure of a plurality of sacrificial strips may indicate the progressive expansion of the rechargeable battery.

Figure 6D:
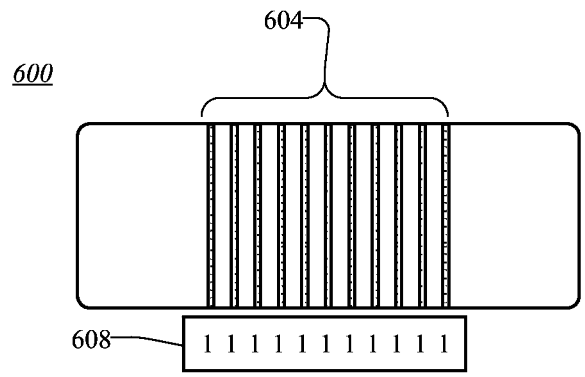
FIG. 6D depicts an example top plan view of an example rechargeable battery and another expansion detector disposed on an exterior surface of the rechargeable battery, showing the rechargeable battery in an unexpanded state.

In still further embodiments, multiple sacrificial strips may be positioned at regular intervals across the surface of the rechargeable battery. For example, as shown in FIG. 6D, eleven sacrificial strips 604 may be positioned at regular intervals across the surface of the rechargeable battery. Each of the sacrificial strips may be electrically coupled to a pull-up or pull-down resistor such that an interrogator 608 may interrogate the resistive expansion detector digitally. In some embodiments, the interrogator 608 may be accessed as a simple memory register. For example, as illustrated, each of the multiple sacrificial strips may be connected to pull-up resistors (not shown) such that the interrogator 608 interprets each of the still-connected sacrificial strips 604 as a digital one.

Figure 6E:
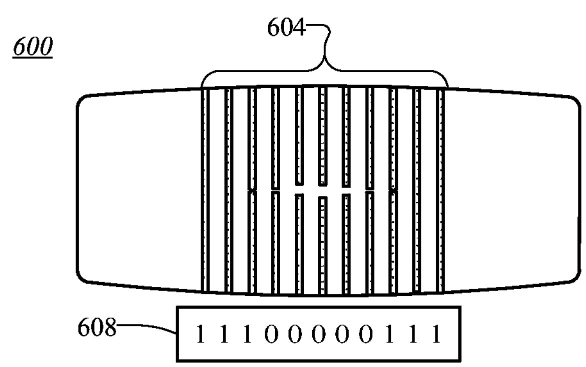
FIG. 6E depicts an example top plan view of the expansion detector of FIG. 6D disposed on an exterior surface of the rechargeable battery, showing the rechargeable battery in an expanded state.

However, upon expansion of the rechargeable battery as shown in FIG. 6E, one or more of the sacrificial strips 604 may break, causing the broken sacrificial strips to be registered by the interrogator 608 as a digital zero.

Figure 7:
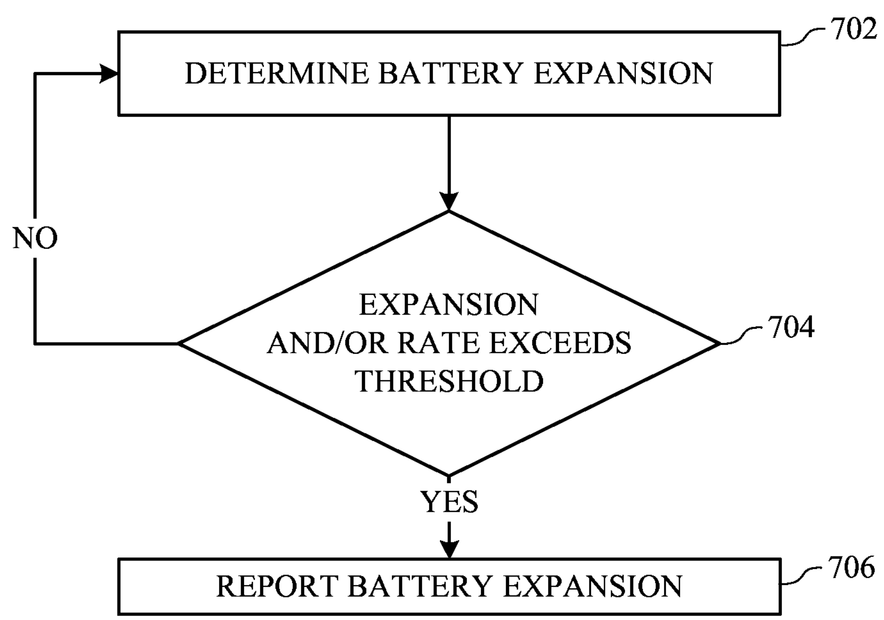
FIG. 7 is a flow chart depicting example operations of a method for detecting rechargeable battery expansion that exceeds a selected threshold.

FIG. 7 is a flow chart depicting example operations of a method for detecting rechargeable battery expansion. The method may begin with operation 702 during which rechargeable battery expansion is detected by any number of suitable means, including the embodiments described herein. Thereafter, at 704, the detected expansion and/or rate of expansion of the rechargeable battery may be compared against a selected threshold. For example, slight (or slow) expansion may not necessarily be a cause for determining that a rechargeable battery is in need of reconditioning or replacement. Once, at 704, the method determines that the expansion of the rechargeable battery (e.g., a dimension of the rechargeable battery at the point that expansion is measured) exceeds the selected expansion threshold, the method may report that the rechargeable battery has expanded or swelled at operation 706.

Figure 8:
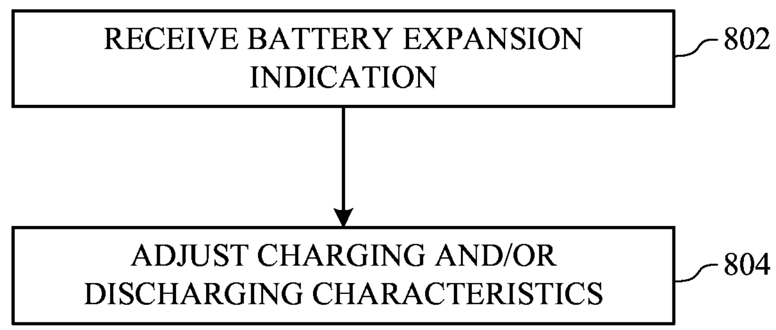
FIG. 8 is a flow chart depicting example operations of a method for compensating for and arresting rechargeable battery expansion.

FIG. 8 is a flow chart depicting example operations of a method for compensating for and arresting rechargeable battery expansion. The method may begin at operation 802 in which the method receives an indication that an associated rechargeable battery has expanded. Thereafter, at operation 804, one or more charging and/or discharging characteristics may be modified or changed. For example, if expansion is detected, the rechargeable battery may be set to charge at a slower rate during future charging cycles.

Figure 9:
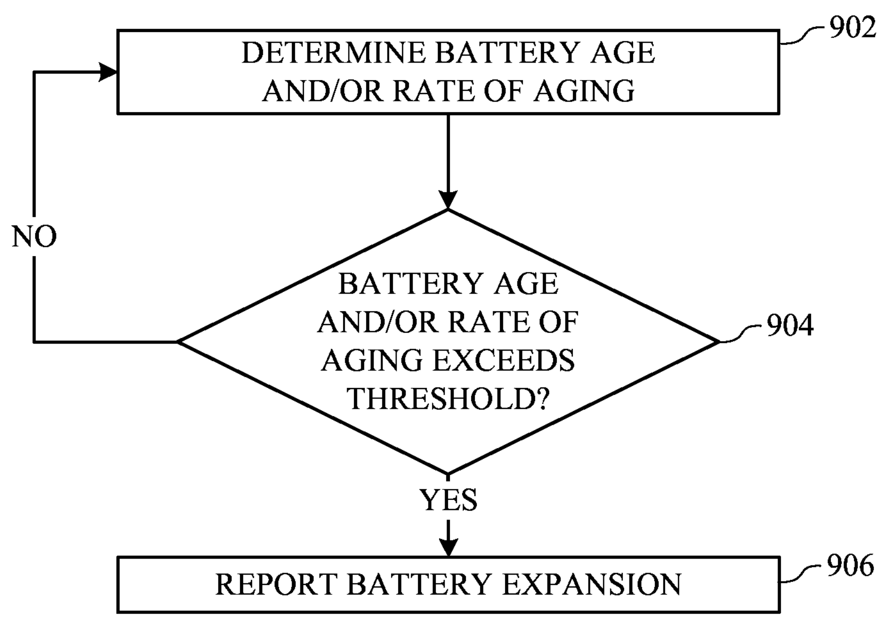
FIG. 9 is another flow chart depicting example operations of a method for predicting and/or inferring rechargeable battery expansion as a result of rechargeable battery age.

FIG. 9 is another flow chart depicting example operations of a method for predicting and or inferring rechargeable battery expansion as a result of rechargeable battery age. The method may begin at operation 902 in which the effective or actual age and/or rate of aging of a rechargeable battery can be determined. For example, the rechargeable battery age may be a calendar age of the rechargeable battery, a charge/discharge cycle count associated with the rechargeable battery, a rechargeable battery expansion detected by an expansion detector, or any other suitable means for determining that a rechargeable battery has expanded. The rate of aging may be determined from historical data relating to previous determinations of rechargeable battery age. Thereafter, at 704, the determined age and/or rate of aging of the rechargeable battery may be compared against a selected threshold. If either or both the determined age and/or rate of aging exceeds the selected thresholds, the method may report a rechargeable battery expansion at operation 906.

Figure 10:
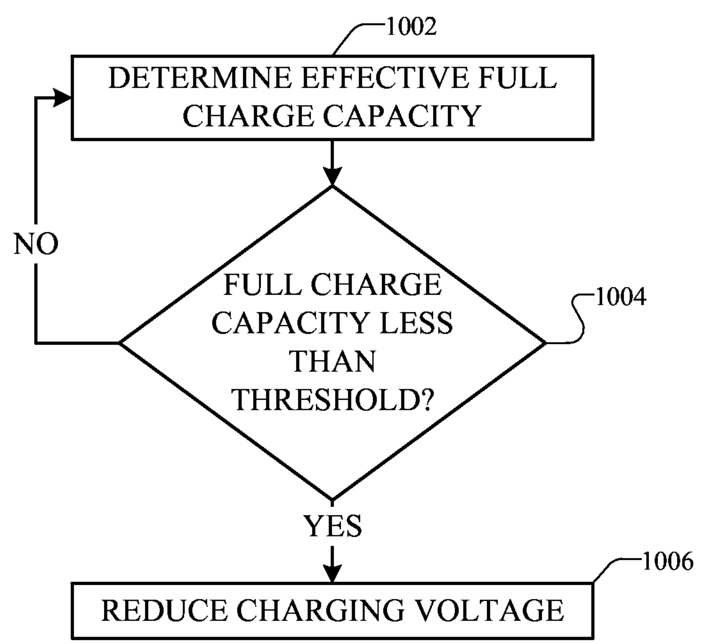
FIG. 10 is another flow chart depicting example operations of a method for mitigating rechargeable battery expansion over time.

FIG. 10 is another flow chart depicting example operations of a method for mitigating rechargeable battery expansion over time. The method may begin at operation 1002 at which an effective target charge capacity can be determined. The target charge capacity of the battery can be measured, determined, estimated, or inferred in any number of suitable ways. For example, certain embodiments may infer the target charge capacity of the rechargeable battery by measuring the resting voltage of the battery. In other examples, the target charge capacity of the rechargeable battery can be estimated by comparing the rechargeable battery discharge voltage profile to a rechargeable battery discharge model stored in a memory. In other examples, other conventional target charge capacity algorithms, circuits, or estimations maybe used.

After the target charge capacity of the rechargeable battery is determined, the method may continue to operation 1004 to determine whether the determined target charge capacity is less than a selected threshold. The selected threshold may indicate the next level at which a processing unit may adjust power characteristics of the rechargeable battery.

In the event that operation 1004 determines that the target charge capacity is less than the selected threshold, the method may continue to operation 1006 at which the maximum charging voltage used to charge the rechargeable battery may be reduced by a selected amount. For example, in some embodiments, the maximum charging voltage may be reduced by an amount proportional to the change in the expected and/or target charge capacity. More particularly, if the target charge capacity drops by 10%, the maximum charging voltage may be reduced by 1.0%. In other examples, the maximum charging voltage can be reduced at fixed or variable intervals in response to drops in the target charge capacity. For example, if the target charge capacity drops by 10%, the maximum charging voltage may be reduced by 50 mV. In other examples, other voltage drop intervals may be used.

Figure 11:
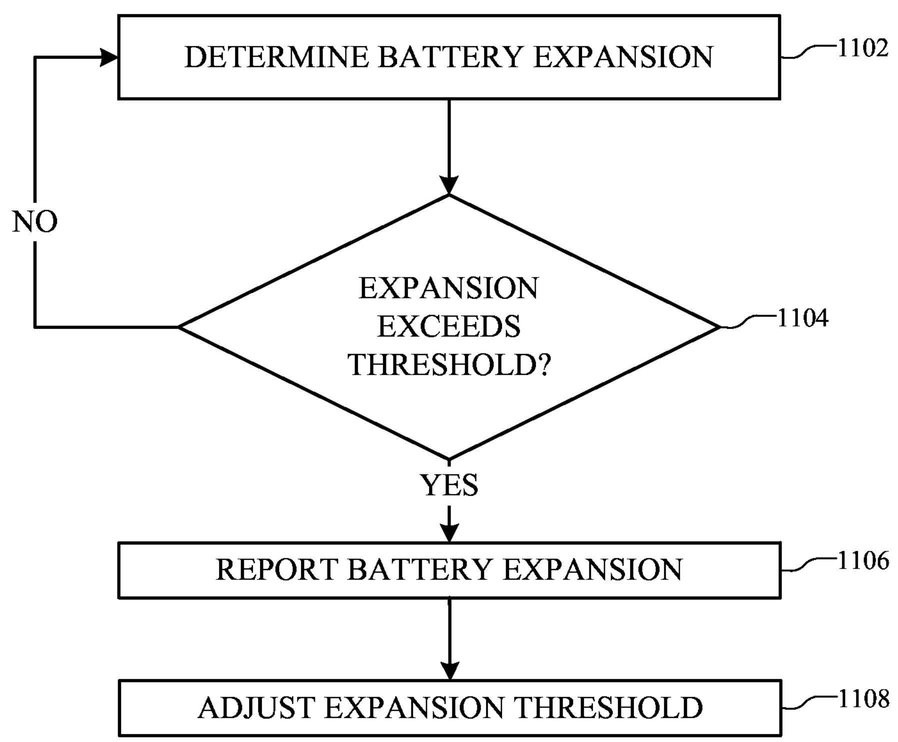
FIG. 11 is another flow chart depicting example operations of a method for predicting and or inferring rechargeable battery expansion as a result of rechargeable battery age.

FIG. 11 is another flow chart depicting example operations of a method for predicting and or inferring rechargeable battery expansion as a result of rechargeable battery age. The method may begin at operation 1102 which can determine whether a rechargeable battery is expanded. Next, operation 1104 can determine whether the expansion exceeds a selected threshold. If the expansion exceeds a selected threshold, the method may continue to operation 1106 that can provide a report that the battery is expanded. Thereafter, the expansion threshold used in operation 1104 may be adjusted at operation 1108.

These and other methods described herein may report rechargeable battery expansion to a processing unit associated with the portable electronic device powered by the rechargeable battery. After receiving the expansion signal the processing unit can respond in any number of ways, regardless whether the signal is derived from an objective measurement of the physical dimensions of the rechargeable battery or whether the signal is derived from an estimation of expected rechargeable battery expansion based on rechargeable battery age or heath.

In the present disclosure, various embodiments relating to systems and methods for detecting and compensating for battery expansion over time are described. However, one may appreciate that each of these embodiments may also apply to monitor for battery contraction over time.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

We claim:

1. An electronic device, comprising:

a rechargeable battery within a housing;

a processing unit configured to control an electrical input generated by a power source and provided to the rechargeable battery; and an expansion detector electrically coupled to the processing unit and comprising a capacitive sensor;

wherein:

the expansion detector sends an expansion signal to the processing unit upon determining that the rechargeable battery has expanded; and in response to receiving the expansion signal, the processing unit modifies one or more characteristics of the electrical input.

2. The electronic device of claim 1, wherein the capacitive sensor comprises:

a first electrically conductive surface coupled to an external surface of the rechargeable battery; and a second electrically conductive surface conductively coupled to the first electrically conductive surface.

3. The electronic device of claim 2, wherein the expansion detector is configured to measure a capacitance between the first electrically conductive surface and the second electrically conductive surface.

4. The electronic device of claim 2, wherein the second electrically conductive surface is coupled to the housing.

5. The electronic device of claim 2, wherein the second electrically conductive surface comprises a top surface of the rechargeable battery; and the external surface of the rechargeable battery comprises a bottom surface of the rechargeable battery.

6. The electronic device of claim 1, wherein the capacitive sensor comprises:

an array of electrically conductive surfaces, each of which is coupled to an external surface of the rechargeable battery.

7. The electronic device of claim 6, wherein the expansion detector is configured to individually measure a capacitance between each electrically conductive surface of the array of electrically conductive surfaces and a reference surface.

8. The electronic device of claim 1, wherein:

the expansion detector comprises a first electrically conductive plate and a second electrically conductive plate separated by an air gap;

the first electrically conductive plate is coupled to an internal surface of the housing; and the second electrically conductive plate is coupled to an external surface of the housing.

9. The electronic device of claim 8, wherein the expansion detector is configured to send the expansion signal to the processing unit upon detecting an electrical connection between the first electrically conductive plate and the second electrically conductive plate.

10. A rechargeable battery within a housing of a portable electronic device, the rechargeable battery comprising:

a rechargeable battery module;

a container containing the rechargeable battery module; and a rechargeable battery expansion detector electrically coupled to a processing unit associated with the portable electronic device, the rechargeable battery expansion detector comprising a capacitive sensor;

wherein:

the rechargeable battery expansion detector sends an expansion signal to the processing unit upon determining that the rechargeable battery has expanded; and in response to receiving the expansion signal, the processing unit modifies one or more characteristics of an electrical input to the rechargeable battery.

11. The rechargeable battery of claim 10, wherein the capacitive sensor comprises:

a first electrically conductive surface; and a second electrically conductive surface;

wherein the first electrically conductive surface is coupled to an external surface of the rechargeable battery.

12. The rechargeable battery of claim 11, wherein the rechargeable battery expansion detector is configured to measure a capacitance between the first electrically conductive surface and the second electrically conductive surface.

13. The rechargeable battery of claim 10, wherein the capacitive sensor comprises:

an array of electrically conductive surfaces, wherein each electrically conductive surface of the array of electrically conductive surfaces is coupled to an external surface of the rechargeable battery.

14. The rechargeable battery of claim 11, wherein the second electrically conductive surface is coupled to the housing.

15. The rechargeable battery of claim 13, wherein:

the array of electrically conductive surfaces is a first array of electrically conductive surfaces coupled to a top surface of the rechargeable battery; and the capacitive sensor further comprises a second array of electrically conductive surfaces coupled to a bottom surface of the rechargeable battery.

16. The rechargeable battery of claim 15, wherein the rechargeable battery expansion detector is configured to measure a capacitance between one of the first array of electrically conductive surfaces and one of the second array of electrically conductive surfaces.

17. The rechargeable battery of claim 13, wherein the rechargeable battery expansion detector is configured to individually measure a capacitance between each electrically conductive surface of the array of electrically conductive surfaces and a reference surface.

18. The rechargeable battery of claim 10, wherein:

the rechargeable battery expansion detector comprises a first electrically conductive plate and a second electrically conductive plate separated by an air gap;

the first electrically conductive plate is coupled to an internal surface of the housing; and the second electrically conductive plate is coupled to an external surface of the housing.

19. The rechargeable battery of claim 18, wherein the rechargeable battery expansion detector is configured to send the expansion signal to the processing unit upon detecting an electrical connection between the first electrically conductive plate and the second electrically conductive plate.

20. The electronic device of claim 1, wherein the capacitive sensor comprises:

a first electrically conductive surface coupled to an external surface of the rechargeable battery;

a second electrically conductive surface; and an insulator coupled to and separating the first electrically conductive surface and the second electrically conductive surface.

21. The electronic device of claim 20, wherein the insulator comprises a cell of the rechargeable battery.

22. The electronic device of claim 20, wherein the second electrically conductive surface is within the rechargeable battery.

* * * * *